United States Patent [19]
Chiba et al.

[11] Patent Number: 5,173,659
[45] Date of Patent: Dec. 22, 1992

[54] HIGHLY SENSITIVE MAGNETIC FIELD DETECTING SQUID WITH DUAL DEMODULATION CIRCUIT

[75] Inventors: Norio Chiba; Nobuhiro Shimizu; Kazuo Chinome; Satoshi Sekiya, all of Tokyo, Japan

[73] Assignee: Seiko Instruments Inc., Japan

[21] Appl. No.: 712,117

[22] Filed: Jun. 7, 1991

[30] Foreign Application Priority Data

Jun. 11, 1990 [JP] Japan .................... 2-151869

[51] Int. Cl.$^5$ .............................. G01R 33/035
[52] U.S. Cl. .................... 324/248; 324/233; 307/306
[58] Field of Search ............... 324/248, 233; 505/844–846; 307/306

[56] References Cited

U.S. PATENT DOCUMENTS

| | | | |
|---|---|---|---|
| 3,758,854 | 9/1973 | Zimmerman | 324/248 |
| 4,315,215 | 2/1982 | Onodera et al. | 324/248 |
| 4,486,713 | 12/1984 | Gifford | 324/233 X |
| 4,514,689 | 4/1985 | Gerard | 324/233 X |
| 4,549,135 | 10/1985 | Vaidya | 324/248 |
| 4,628,260 | 12/1986 | Kimoto et al. | 324/233 X |

Primary Examiner—Gerald R. Strecker
Assistant Examiner—Warren S. Edmonds
Attorney, Agent, or Firm—Bruce L. Adams; Van C. Wilks

[57] ABSTRACT

A highly sensitive magnetic field detecting system includes a DC superconducting quantum interference device (DC SQUID) for detecting a magnetic field to produce a signal voltage, and a flux locked loop (F.L.L.) circuit device for driving the DC SQUID. A phase detecting circuit forming part of the F.L.L. circuit device is composed of two phase detecting circuits having different phases to be detected. By adding the individual output signals of the two phase detecting circuits, the outputs can be unvaried at a phase difference equal to that of the detected phases of the two detecting circuits. The added signal is also unvaried with respect to the phase variations of the detected signal so that the metering procedures can be simplified without any necessity for phase adjustment. Further, the output signals obtained can be stable relative to the phase drifts of the signal to be transmitted from the DC SQUID to improve the metering precision.

10 Claims, 3 Drawing Sheets

HIGHLY SENSITIVE MAGNETIC FIELD DETECTING SQUID WITH DUAL DEMODULATION CIRCUIT

BACKGROUND OF THE INVENTION

1. Field of the Invention

The present invention relates to a magnetic flux meter using a DC driven type superconducting quantum interference device (hereinafter referred to as DC SQUID) and, more particularly, to a structure of a phase detecting circuit forming part of a flux locked loop (hereinafter referred to as F.L.L.) circuit device.

2. Description of the Prior Art

FIG. 4 is a block diagram showing on example of the structure of the conventional magnetic flux meter. A DC SQUID is provided for a sensor. A block enclosed by dotted lines, as designated at 21, is a phase detecting circuit. A modulated signal outputted from a DC SQUID 4 and amplified by an amplifier 5, is detected by a phase detector 22. The output signal of a square wave oscillator 6 or generating means is used as a signal for modulating the DC SQUID 4 and a reference signal for the phase detector 22. In order that the signal from the DC SQUID and the reference signal may have their phases coincided in the phase detector 22, the reference signal has its phase adjusted by a phase shifter 23.

Since the conventional DC SQUID magnetic flux meter is constructed as described above, an optimum output signal cannot be achieved without the phase adjustment in the phase shifter if the phases of the signal outputted from the DC SQUID and the reference signal are different. Another problem is that an output signal can not be obtained which is stable against the phase drift of the signal to be transmitted from the DC SQUID.

SUMMARY OF THE INVENTION

It is an object of the present invention to provide a magnetic flux meter with a stable output signal.

It is another object of the present invention to provide a magnetic flux meter with improved metering precision.

It is further object of the present invention to provide a magnetic flux meter without any necessity for the phase adjustment.

In order to achieve the above-specified objects, according to the present invention, the phase detecting circuit forming part of the F.L.L. circuit device is composed of a first and a second phase detecting circuit, each having different phases to be detected, so that a detected output, or added demodulation signal, may be obtained by adding respective first and second individual demodulated output signals from the two phase detecting circuits. The first and second phase detecting circuits receive a respective first and second reference signal from generating means, which comprises an oscillator.

According to the aforementioned structure, the added demodulation signal can be unvaried at a phase difference equal to that of the detected phases of the two detecting circuits with respect to the phase variations of the detected signal so that the metering procedures can be simplified without requiring the phase adjustment. Also, the output signal obtained can be stable relative to the phase drift of the signal to be transmitted from the DC SQUID to thereby improve the metering precision.

DETAILED DESCRIPTION OF THE PREFERRED EMBODIMENTS

The embodiments of the present invention will be described in the following with reference to the accompanying drawings.

Figure 1:
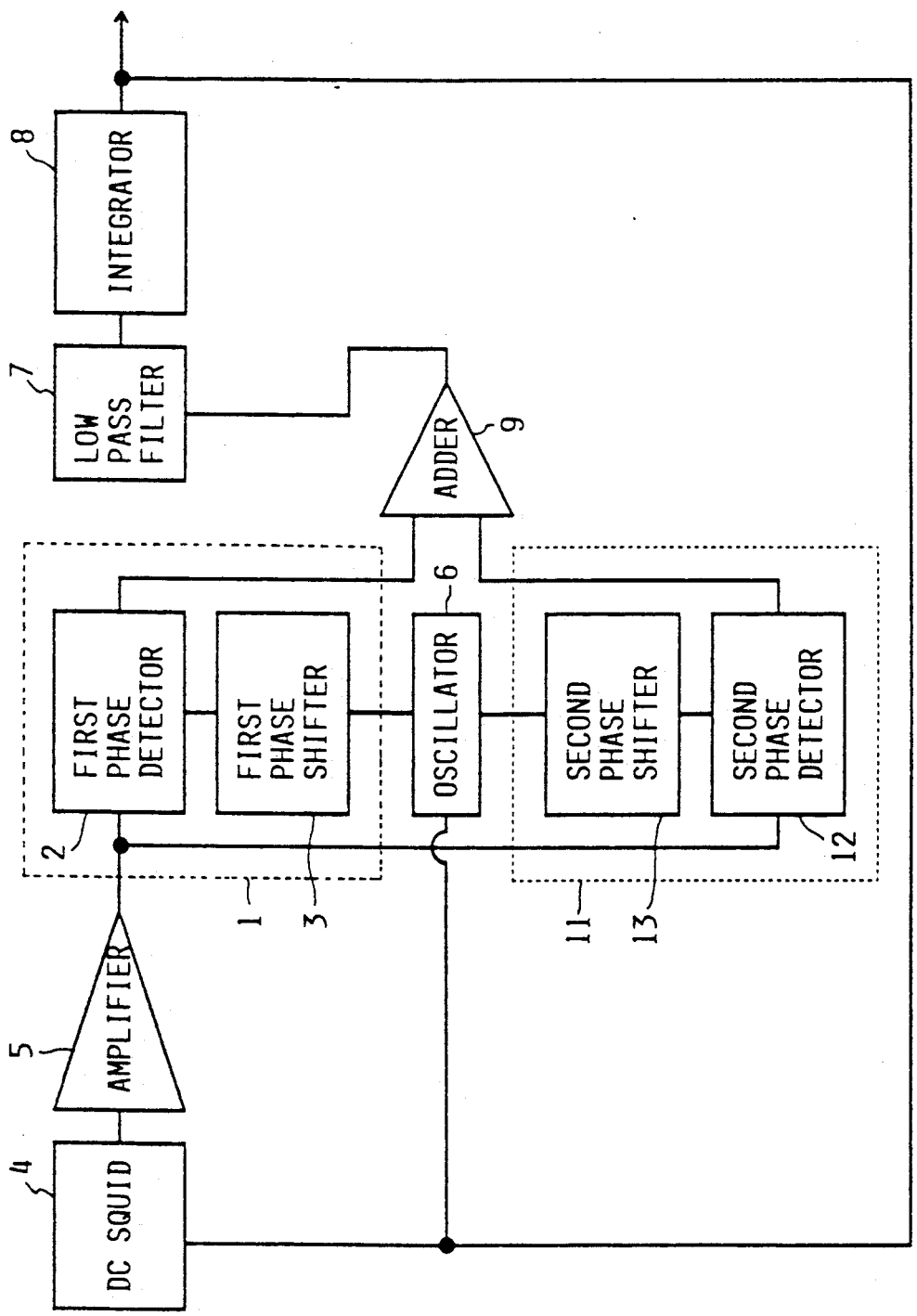
FIG. 1 is a block diagram showing the DC SQUID magnetic flux meter according to a first embodiment of the present invention.
Figure 2:
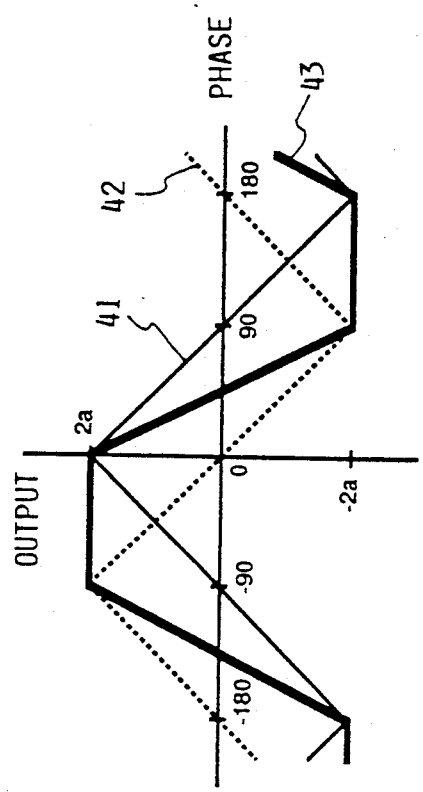
FIG. 2 is a graph plotting the relations between the phase shifts of the detected signals of the amplitude a of the embodiment and the magnitude of the detector output.

FIG. 1 is a block diagram showing the structure of a DC SQUID magnetic flux meter according to a first embodiment of the present invention. Block 1 enclosed by dotted lines is a first phase detecting circuit. block 11 enclosed by dotted lines is a second phase detecting circuit and block 9 is an adder. If a first phase shifter 3 has a shift of $\theta = 0°$ and if a second phase shifter 13 has a shift of $\theta = -90°$, the output of the adder 9 is constant and has no gain variation if the phase of the signal transmitted from the DC SQUID to the phase detector is within a range from $\theta = 0°$ to $\theta = -90°$. If the phase shift is 0°, the phase shifter can be omitted. FIG. 2 is a graph plotting the relations between the phase drift of the detected signal having an amplitude a in the aforementioned embodiment and the magnitude of the detector output. A curve 41 plots the output of the first phase detecting circuit 1 when the reference signal has a phase of $\theta = 0°$. A curve 42 plots the output of the second phase detecting circuit 11 when the reference signal has a phase of $\theta = -90°$ and, a curve 43 plots the added output of the curves 41 and 42. The output of the adder is constant at 2a for a phase ranging from $-90°$ to $0°$. According to the structure shown in FIG. 1, as has been described hereinbefore, the outputs can be unvaried with respect to the phase variations of the detected signal so that the metering procedures can be simplified without any necessity for the phase adjustment, and the output signal obtained can be stable for the phase drift of the signal to be transmitted from sensing means, or the DC SQUID 4 to improve the metering precision.

If the difference between the shift $\theta_1$ of the first phase shifter 3 and the shift $\theta_2$ of the second phase shifter 13 is 90° in the embodiment shown in FIG. 1, and if the phase of the signal to be transmitted from the DC SQUID to the phase detector is within a range from $\theta_1$ to $\theta_2$, the output of the adder 9 is unvaried with respect to the phase variation and has no gain variation. The operations and effects resulting from the setting of this phase shifter are not different from those of the preceding embodiment excepting that the effective phase range is varied.

If the difference between the shift $\theta_1$ of the first phase shifter 3 and the shift $\theta_2$ of the second phase shifter 13 is smaller than 90° in the embodiment shown in FIG. 1, the output of the adder 9 has an enlarged gain but no variation for the phase variation if the phase of the signal transmitted from the DC SQUID to the phase detector is within $\theta_1$ and $\theta_2$. The operations and effects resulting from the setting of this phase shifter are not different from those of the preceding embodiment excepting that the effective phase range is varied and that the gain is enlarged.

If the difference between the shift $\theta_1$ of the first phase shifter 3 and the shift $\theta_2$ of the second phase shifter 13 is larger than 90° but smaller than 180° in the embodiment shown in FIG. 1, the output of the adder 9 has a reduced gain but no variation for the phase variation if the phase of the signal transmitted from the DC SQUID to the phase detector is within $\theta_1$ and $\theta_2$. The operations and effects resulting from the setting of this phase shifter are not different from those of the preceding embodiment excepting that the effective phase range is varied and that the gain is enlarged.

Figure 3:
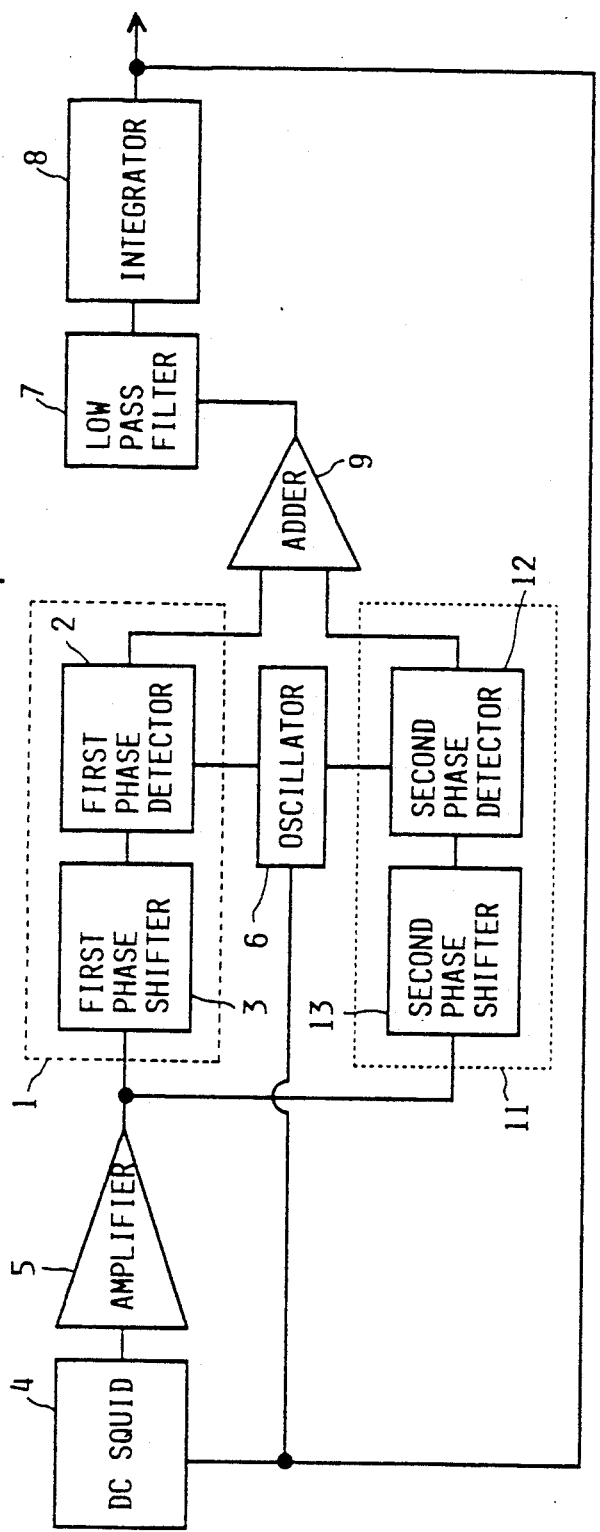
FIG. 3 is a block diagram showing the DC SQUID magnetic flux meter according to the second embodiment of the present invention.
Figure 4:
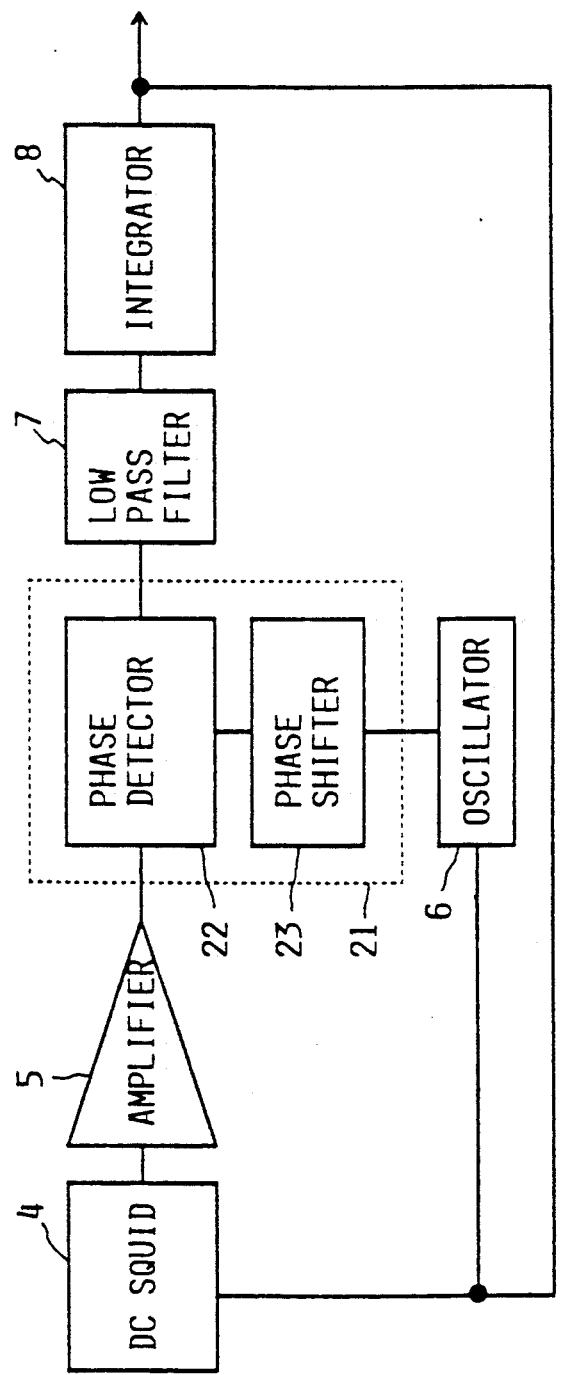
FIG. 4 is a block diagram showing a conventional DC SQUID magnetic flux meter.

FIG. 3 is a block diagram showing the structure of a DC SQUID magnetic flux meter according to a second embodiment of the present invention. Block 1 enclosed by dotted lines, is a first phase detecting circuit. Block 11, enclosed by dotted lines, is a second phase detecting circuit and block 9 is an adder. The difference of this embodiment from the embodiment shown in FIG. 1, is the positions at which the phase shifters 3 and 13 are disposed. Even if the phase shifters 3 and 13 are attached to the detected signal, their operations and effects are not different from those of the embodiment shown in FIG. 1.

As has been described hereinbefore, according to the present invention, the phase detecting circuit forming part of the F.L.L. circuit device is composed of the two phase detecting circuits having different phases to be detected. By adding these individual output signals, the added output can be unvaried at a phase difference equal to that of the detected phases of the two detecting circuits with respect to the phase variations of the detected signal so that the metering procedures can be simplified without any necessity for the phase adjustment, and the output signal obtained can be stable against the phase drift of the signal to be transmitted from the DC SQUID to improve the metering precision.

What is claimed is:

1. A highly sensitive magnetic field detecting apparatus, comprising:
   sensing means comprised of a DC superconducting quantum interference device for sensing a magnetic field and producing an output signal corresponding to a magnitude of the magnetic field;
   oscillator means for modulating the output signal of the sensing means and generating first and second reference signals for demodulating the modulated output signal of the sensing means;
   first phase sensitive detecting means for demodulating the output signal of the sensing means by the first reference signal;
   second phase sensitive detecting means for demodulating the output signal of the sensing means by the second reference signal, the second reference signal having a different phase relation than the first reference signal relative to the output signal of the sensing means;
   adder means for adding outputs of the first phase detecting means and the second phase detecting means to produce a demodulation signal which is stable against a a phase drift of the output signal of the sensing means; and
   signal output means for processing the demodulation signal and for outputting a metering signal corresponding to the magnitude of the magnetic field.

2. A magnetic field detecting apparatus according to claim 1; wherein the first phase detecting means includes a first phase shifter for shifting the phase of the first reference signal received by the first phase detecting means.

3. A magnetic field detecting apparatus according to claim 1; wherein the second phase detecting means includes a second phase shifter for shifting the phase of the second reference signal received by the second phase detecting means.

4. A magnetic field detecting apparatus according to claim 1; wherein the signal output means comprises a low pass filter for filtering the output signal of the adder means, and an integrator for integrating an output signal of the low pass filter.

5. A magnetic field detecting apparatus, comprising: sensing means, including a DC superconducting quantum interference device, for sensing a magnitude of a magnetic field and producing an output signal in response thereto; generating means for modulating the output signal and for generating a first reference signal and a second reference signal for demodulating the modulated output signal first phase detecting means receptive of the modulated output signal and the first reference signal for detecting a difference therebetween, effective for demodulating the modulated output signal by the first reference signal, and producing a first demodulated signal; second phase detecting means receptive of the modulated output signal and the second reference signal for detecting a difference therebetween, effective for demodulating the modulated output signal by the second reference signal, and producing a second demodulated signal; means for adding the first and the second demodulated signals to produce an added demodulation signal which is stable against a phase drift of the output signal; and signal outputting means for processing the added demodulation signal and for outputting a metering signal corresponding to the magnitude of the magnetic field.

6. A magnetic field detecting apparatus according to claim 5; wherein the generating means includes an oscillator.

7. A magnetic field detecting apparatus according to claim 5; wherein the first phase detecting means includes a phase shifter for shifting the phase of the first reference signal.

8. A magnetic field detecting apparatus according to claim 7; wherein the second phase detecting means includes a second phase shifter for shifting the phase of the second reference signal.

9. A magnetic field detecting apparatus according to claim 5; wherein the second phase detecting means includes a phase shifter for shifting the phase of the second reference signal.

10. A magnetic field detecting apparatus according to claim 5; wherein the signal outputting means comprises a low pass filter for filtering the added demodulation signal and producing a filtered output signal, and an integrator for integrating the filtered output signal.

* * * * *